United States Patent
Kato et al.

(10) Patent No.: US 7,998,584 B2
(45) Date of Patent: Aug. 16, 2011

(54) HIGH-PURITY CARBON FIBER-REINFORCED CARBON COMPOSITE AND METHOD FOR PRODUCING THE SAME

(75) Inventors: Hideki Kato, Gifu (JP); Masahiro Yasuda, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 296 days.

(21) Appl. No.: 12/431,223

(22) Filed: Apr. 28, 2009

(65) Prior Publication Data

US 2009/0274888 A1 Nov. 5, 2009

(30) Foreign Application Priority Data

Apr. 30, 2008 (JP) ................................. 2008-119400

(51) Int. Cl.
*B32B 9/00* (2006.01)
(52) U.S. Cl. .................... 428/408; 428/293.4; 423/447.2
(58) Field of Classification Search ............... 428/293.4, 428/408, 304.4; 423/447.2; 264/29.1
See application file for complete search history.

(56) References Cited

U.S. PATENT DOCUMENTS

| | | | |
|---|---|---|---|
| 2,814,076 A * | 11/1957 | Gartland | 423/448 |
| 6,136,094 A | 10/2000 | Yamaji et al. | |
| 6,455,160 B1 * | 9/2002 | Hiraoka et al. | 428/408 |
| 2008/0057303 A1 | 3/2008 | Tsushima et al. | |
| 2009/0274888 A1 * | 11/2009 | Kato et al. | 428/304.4 |

FOREIGN PATENT DOCUMENTS

| | | |
|---|---|---|
| JP | 7-48191 | 2/1995 |
| JP | 10-152391 | 6/1998 |
| JP | 2002-173392 | 6/2002 |
| WO | WO 2006/003774 | 1/2006 |

* cited by examiner

*Primary Examiner* — N. Edwards
(74) *Attorney, Agent, or Firm* — Ditthavong Mori & Steiner, P.C.

(57) ABSTRACT

A high-purity carbon fiber-reinforced carbon composite includes a matrix, a carbon fiber, and sulfur. The matrix includes a crystalline carbon-based powder and glassy carbon. A content of sulfur in the high-purity carbon fiber-reinforced carbon composite is 5 ppm by mass or less.

10 Claims, 5 Drawing Sheets

HIGH-PURITY CARBON FIBER-REINFORCED CARBON COMPOSITE AND METHOD FOR PRODUCING THE SAME

CROSS-REFERENCE TO RELATED APPLICATION

The present application claims priority under 35 U.S.C. §119 to Japanese Patent Application No. 2008-119400, filed on Apr. 30, 2008. The contents of this application are incorporated herein by reference in their entirety.

BACKGROUND OF THE INVENTION

1. Field of the Invention

The present invention relates to a high-purity carbon fiber-reinforced carbon composite (C/C composite) and a method for producing the high-purity carbon fiber-reinforced carbon composite.

2. Description of the Related Art

A carbon fiber-reinforced carbon composite (hereinafter also referred to as a C/C composite) has advantages of being light in weight, being strong in strength and being able to easily grow in size. Therefore, it is widely used for a silicon single crystal pulling-up apparatus, a silicon polycrystal manufacturing apparatus, a semiconductor manufacturing apparatus and the like.

In such uses, high-purity C/C composites refined by using a halogen gas is used, in order to suppress contamination of silicon single crystals and the like with impurities such as metals.

A C/C composite is obtained by shaping carbon fibers or graphite fibers to form a formed article by a method such as filament winding, impregnating the formed article with a binder containing a thermosetting resin such as a phenol resin, and curing and burning it. The obtained C/C composite is refined with a halogen gas, and thereafter, used for the above-mentioned usage (see JP-A-10-152391 and JP-A-2002-173392). The thermosetting resin used in impregnation becomes amorphous glassy carbon in the course of burning.

However, according to the related-art production method, sufficient strength can not be obtained by single impregnation, so that impregnation, curing and burning processes are repeated several times, thereby obtaining sufficient strength.

Further, the related-art C/C composite is low in gas permeability. The reason for this can be considered as follows. A matrix of the C/C composite is mainly composed of amorphous glassy carbon, which has a gas impermeable property. Moreover, impregnation is repeated several times, so that continuous pores leading from a surface layer of the composite to an inside thereof become extremely thin, or a part of the pores become a closed pore not leading to an outside thereof. Therefore, it is difficult to remove impurity mainly composed of metal elements included in the inside of the composite by the related-art refining method of heating the composite in the halogen gas.

In order to solve the above problem, it has been studied to mainly use a crystalline carbon-based powder material such as coke or graphite as a third component of the C/C composite so as to decrease the proportion of the glassy carbon in a product (see JP-A-7-48191 and WO2006/003774).

Such a three-component C/C composite includes: a small amount of the glassy carbon, which is originally gas-impermeable, and impurities inside of which are hard to be removed; the high-density crystalline carbon-based material; the low-density carbon fibers; and the low-density glassy carbon for binding these, which is obtained by carbonizing a phenol resin or the like. Accordingly, the three-component C/C composite can have more voids in the inside thereof than the related-art two-component C/C composite including the low-density carbon fibers and the low-density glassy carbon, even when the three-component C/C composite has the same bulk density as the related-art two-component C/C composite. Therefore, it is considered that a refining gas (halogen gas) can penetrate into the inside of the composite, thereby making it easy to remove the impurities mainly including metal elements.

Figure 2:
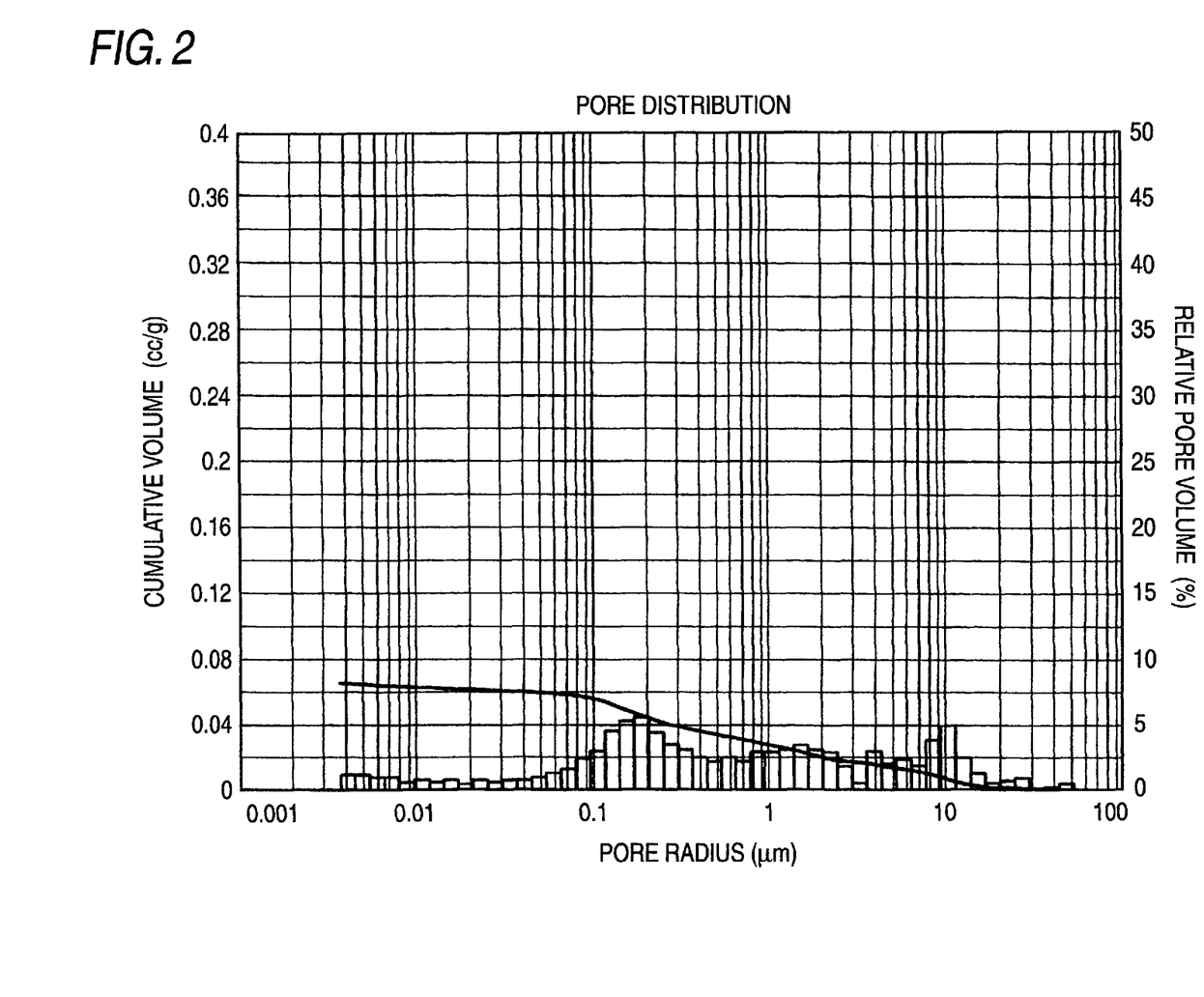
FIG. 2 is a graph showing pore distribution of a two-component C/C composite.
Figure 3:
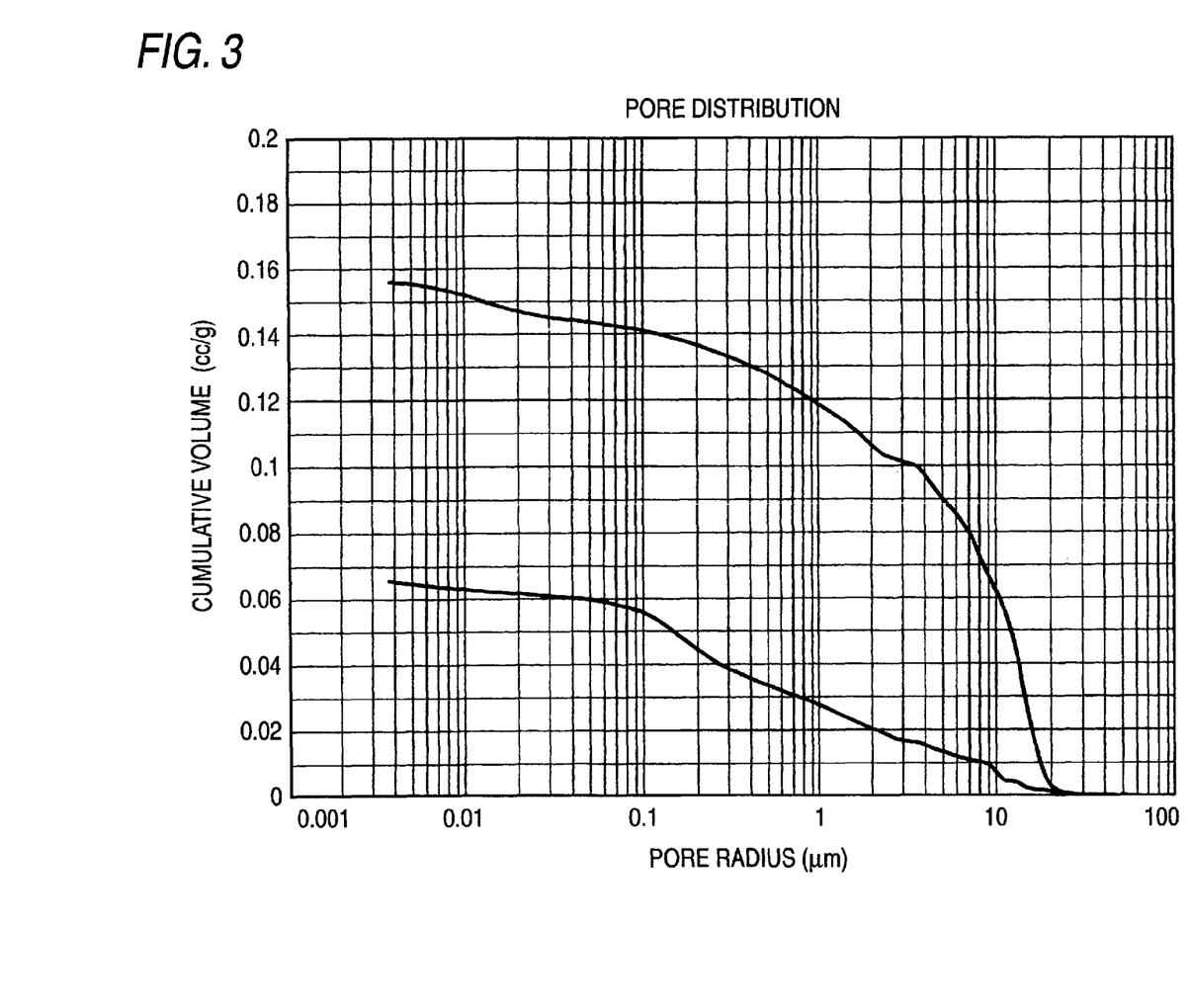
FIG. 3 is a graph showing cumulative pore distribution of the three-component C/C composite and the related-art two-component C/C composite.
Figure 4:
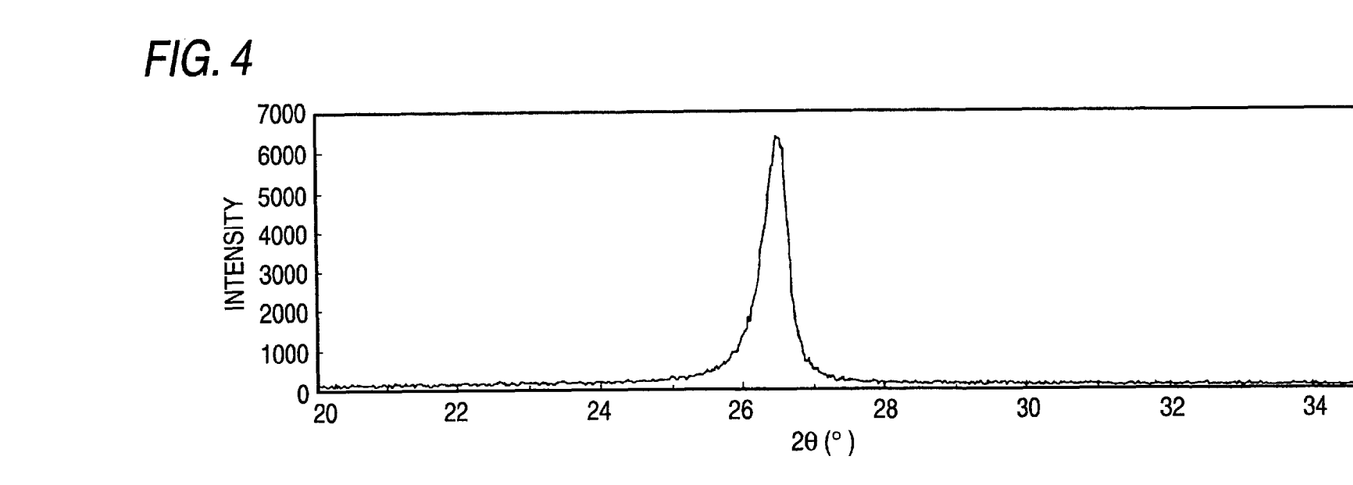
FIG. 4 is a graph showing X-ray diffraction measurement of the three-component C/C composite.
Figure 5:
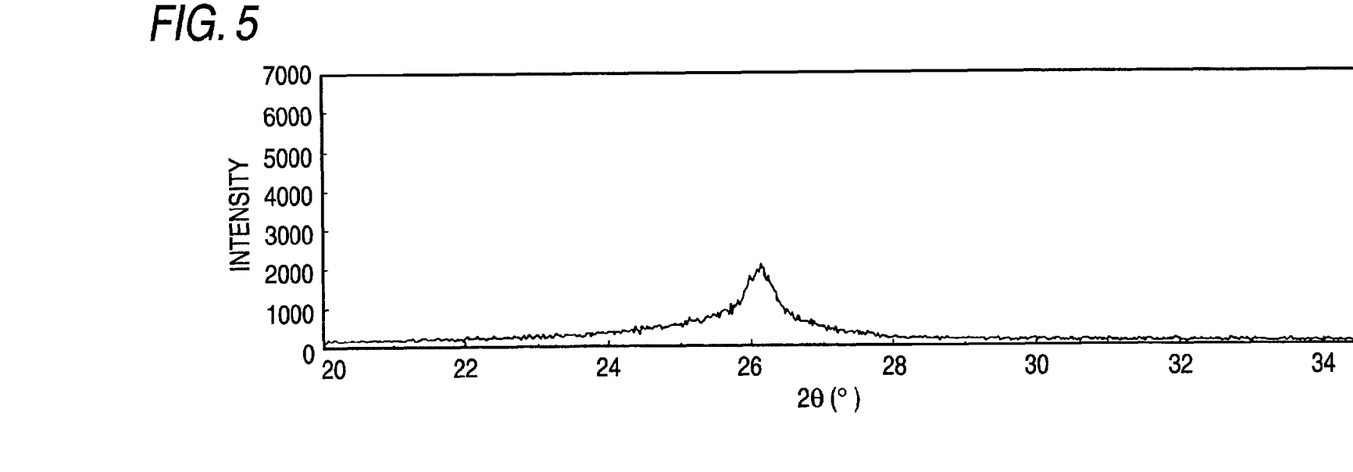
FIG. 5 is a graph showing X-ray diffraction measurement of the two-component C/C composite.

Table 1 shows physical properties of one example of a three-component C/C composite and one example of a two-component C/C composite. Further, FIG. 1 shows a graph of pore distribution of a three-component C/C composite measured by a mercury penetration method using a porosimeter manufactured by Thermo Finnigan, FIG. 2 shows a graph of pore distribution of a two-component C/C composite, FIG. 3 shows a graph of cumulative pore distribution of the three-component C/C composite and the relate-art two-component C/C composite, FIG. 4 shows a graph of X-ray diffraction measurement of the three-component C/C composite, and FIG. 5 shows a graph of X-ray diffraction measurement of the two-component C/C composite.

TABLE 1

|  | Three-Component C/C Composite | Two-Component C/C Composite |
|---|---|---|
| True density (g/cm$^3$) | 2.24 | 1.86 |
| Bulk Density (g/cm$^3$) | 1.57 | 1.65 |
| Porosity (%) | 24.5 | 10.9 |
| X-Ray Diffraction Measurement (002) Half-Value Width (°) | 0.4 | 0.6 |
| Tensile Strength in Fiber Orientation Direction (MPa) | 87 | 121 |

Figure 1:
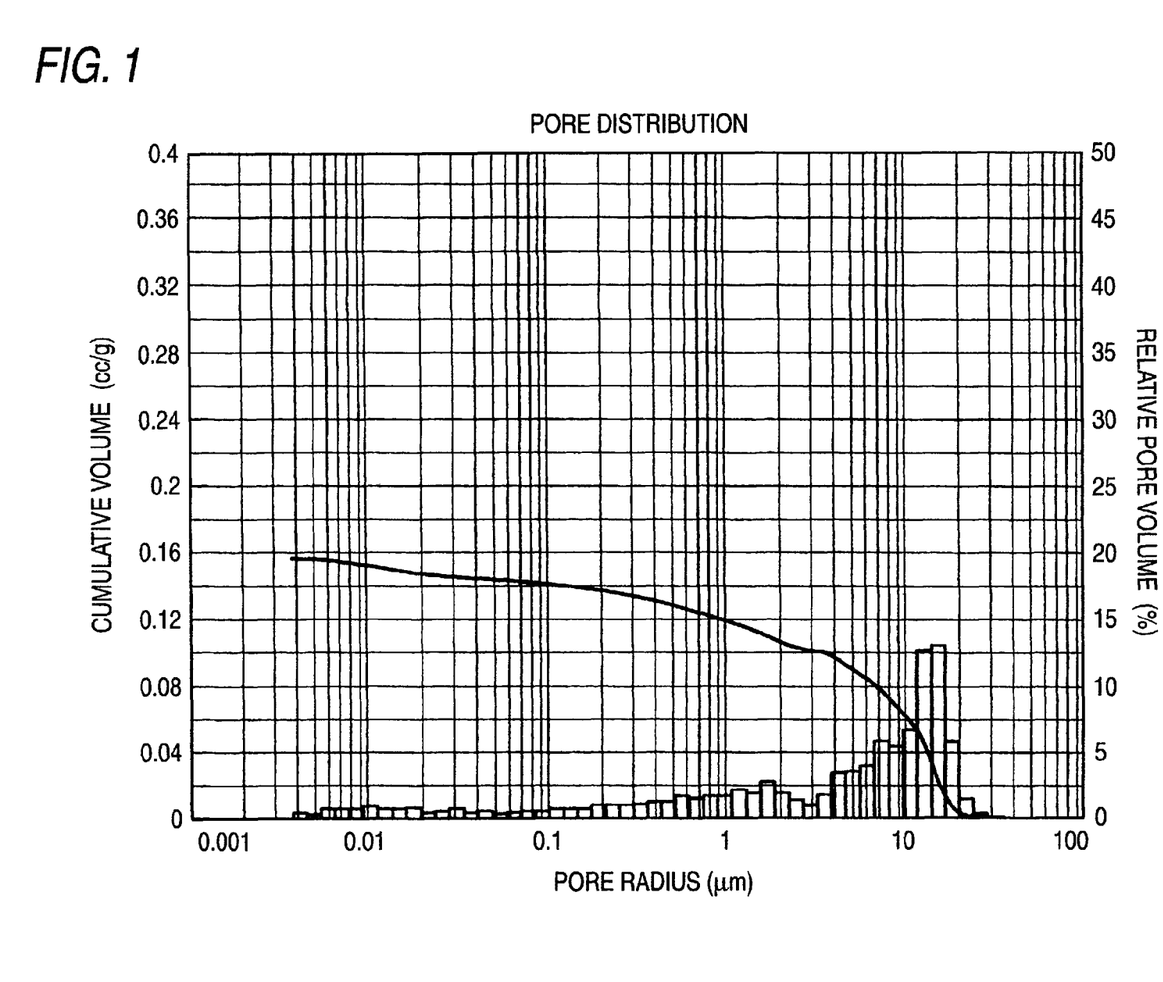
FIG. 1 is a graph showing pore distribution of a three-component C/C composite.

FIG. 1 reveals that in the three-component system, pores having a radius of about 10 μm concentrate. FIG. 2 reveals that in the two-component system, pores are widely distributed between 0.1 and 10 μm. And, FIG. 3 reveals that the three-component system has more pores compared to the two-component system. Further, Table 1 reveals that the three-component system is higher in porosity than the two-component system because of its high true density, although the three-component system and the two-component system have substantially equal level of bulk density.

FIGS. 4 and 5, and Table 1 show that the three-component C/C composite has a higher crystallinity compared to the two-component C/C composite since the peak intensity on the 002 plane of the three-component C/C composite is sharp. In other words, it can be said that the true density of the three-component C/C composite is higher than that of the two-component C/C composite.

Table 1 reveals that even the three-component system has a tensile strength in a fiber orientation direction exceeding 50 MPa. That is, the three-component system has a strength sufficient for use as a member of a semiconductor manufacturing apparatus.

Further, in the three-component C/C composite, the content of a binder such as a phenol resin which produces a large amount of volatile matter in raw materials is small, so that the high-density C/C composite can be obtained by single impregnation without repeating impregnation. Therefore, it is advantageous that the processes can be substantially simplified as compared to the two-component system.

SUMMARY OF THE INVENTION

According to one aspect of the present invention, a high-purity carbon fiber-reinforced carbon composite includes a matrix, a carbon fiber, and sulfur. The matrix includes a crystalline carbon-based powder and glassy carbon. A content of sulfur in the high-purity carbon fiber-reinforced carbon composite is 5 ppm by mass or less.

According to another aspect of the present invention, a method for producing a high-purity carbon fiber-reinforced carbon composite includes providing a carbon fiber-reinforced carbon composite in a refining furnace. The carbon fiber-reinforced carbon composite includes a carbon fiber and a matrix including a crystalline carbon-based powder and glassy carbon. An inside of the refining furnace is vacuumed in which the carbon fiber-reinforced carbon composite is provided. The carbon fiber-reinforced carbon composite provided in the refining furnace is heated to a temperature range from about 1,800° C. to about 2,400° C. after the inside of the refining furnace is vacuumed. A halogen-based gas is introduced into the refining furnace so that a pressure in the refining furnace becomes about 50 kPa or more in a first step after the carbon fiber-reinforced carbon composite is heated. The inside of the refining furnace is vacuumed so that the pressure in the refining furnace becomes about 20 kPa or less in a second step after the first step. The first step and the second step are alternately repeated.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Embodiments will now be described with reference to the accompanying drawings, wherein like reference numerals designate corresponding or identical elements throughout the various drawings.

<Carbon Fiber-Reinforced Carbon Composite (C/C Composite)>

As a carbon fiber in the high-purity carbon fiber-reinforced carbon composite according to an exemplary embodiment of the present invention, there can be used a pitch-based or PAN-based carbon fiber or a graphite fiber further heat treated. Among these, the PAN-based carbon fiber is advantageous in adhesion with a binder resin and has adequate flexibility so as to easily follow some deformation. Therefore, the C/C composite which is hardly cracked or crushed even when external force is applied to deform it.

The high-purity carbon fiber-reinforced carbon composite according to the exemplary embodiment further includes a matrix including a crystalline carbon-based powder and glassy carbon.

The crystalline carbon-based powder which is one of the constituents of the matrix is one obtained by carbonizing an easily crystallizable carbon-based material by heat treatment. As the easily crystallizable carbon-based material, there can be suitably utilized petroleum-derived or coal-derived coke or graphite. The crystalline carbon-based powder is not necessary to be crystalline at a stage of a raw material (namely, the easily crystallizable carbon-based material), and also includes a carbonaceous powder convertible to a crystalline carbonaceous powder by burning, such as green coke and mesocarbon. Among these, coke in which crystallization does not sufficiently proceed is particularly preferred, because such coke has many functional groups at terminals of aromatic rings, so that it is high in adhesion with the binder resin. Additionally, contraction due to heat treatment is larger than a decrease in weight, so that the C/C composite having high density and high strength can be obtained. The content of the crystalline carbon-based powder is from 20 to 75% by mass, and preferably from 30 to 50% by mass, based on the total mass of the carbon fiber, crystalline carbon-based powder and glassy carbon. When the content is 20% by mass or more, refinement of the metal impurities does not become difficult, and it does not happen to substantially become the two-component system. Accordingly, the strength which can stand practical use can be obtained without repeating impregnation several times. When the content is 75% by mass or less, the content of the carbon fibers does not decrease, so that the strength which can stand practical use can be obtained. The content of the crystalline carbon-based powder can be controlled by adjusting the content of the easily crystallizable carbon-based material as a raw material to the above-mentioned range based on the total mass of the carbon fiber, the easily crystallizable carbon-based material and the binder resin.

The glassy carbon which is one of the constituents of the matrix is one obtained by carbonizing the binder resin by heat treatment. As the binder resin, there can be utilized a thermosetting resin having a high carbonization yield such as a novolac or resol phenol resin, a furan resin, a polyimide resin or a cyanate ester compound. Among these, the phenol resin is preferred. The content of the glassy carbon is preferably from 10 to 40% by mass, and more preferably from 15 to 35% by mass, based on the total mass of the carbon fiber, the crystalline carbon-based powder and the glassy carbon. When the content is within the range of 10 to 40% by mass, the sufficient strength can be obtained without repeating impregnation. The content of the glassy carbon can be controlled by adjusting the content of the binder resin as a raw material to the above-mentioned range based on the total mass of the carbon fibers, the easily crystallizable carbon-based material and the binder resin.

In the exemplary embodiment, in addition to the above, an additive such as silicon, SiC or a metal can be appropriately added to the high-purity carbon fiber—reinforced carbon composite.

In the high-purity carbon fiber-reinforced carbon composite according to an exemplary embodiment of the present invention, a true density thereof is preferably from about 2.0 to about 2.265 g/cm$^3$, and more preferably from about 2.05 to about 2.265 g/cm$^3$. When the true density is within the above-mentioned range, the continuous pores leading to the outside of the material are easily formed, so that the impurities present in the C/C composite are easily removed with a refining gas. The true density of the glassy carbon obtained by carbonizing the binder resin is approximately from about 1.4 to about 1.6 g/cm$^3$, and the true density of the carbon fiber is from about 1.5 to about 2.0 g/cm$^3$. Accordingly, the true density of the related-art two-component C/C composite obtained therefrom is roughly calculated to be at most from about 1.4 to about 2.0 g/cm$^3$. Compared to this, in the three-component C/C composite according to an exemplary embodiment of the present invention, the easily crystallizable carbon-based material such as coke or graphite which has a true density of about 2.10 to about 2.265 g/cm$^3$ after heat treatment is used, and the content of the binder resin and the like lower in true density after heat treatment is small by the amount. It is therefore considered that the true density of the whole C/C composite exhibits a value as high as about 2.0 to about 2.265 g/cm$^3$ described above.

The true density can be measured, for example, with a commercially available true density meter (Penta-Pycnometer manufactured by Yuasa Ionics Inc.) or the like.

In the carbon fiber-reinforced carbon composite according to an exemplary embodiment of the present invention, the bulk density is preferably from about 1.40 to about 1.80 g/cm$^3$, and more preferably from about 1.45 to about 1.70 g/cm$^3$. When the bulk density is within the above-mentioned range, the sufficient strength can be obtained, and the continuous pores leading to the outside of the material are easily formed, so that the impurities present in the C/C composite are easily removed with a refining gas.

The bulk density can be measured, for example, by dividing the mass of the carbon composite by the volume of the carbon composite obtained by dimension measurement.

Figure 6:
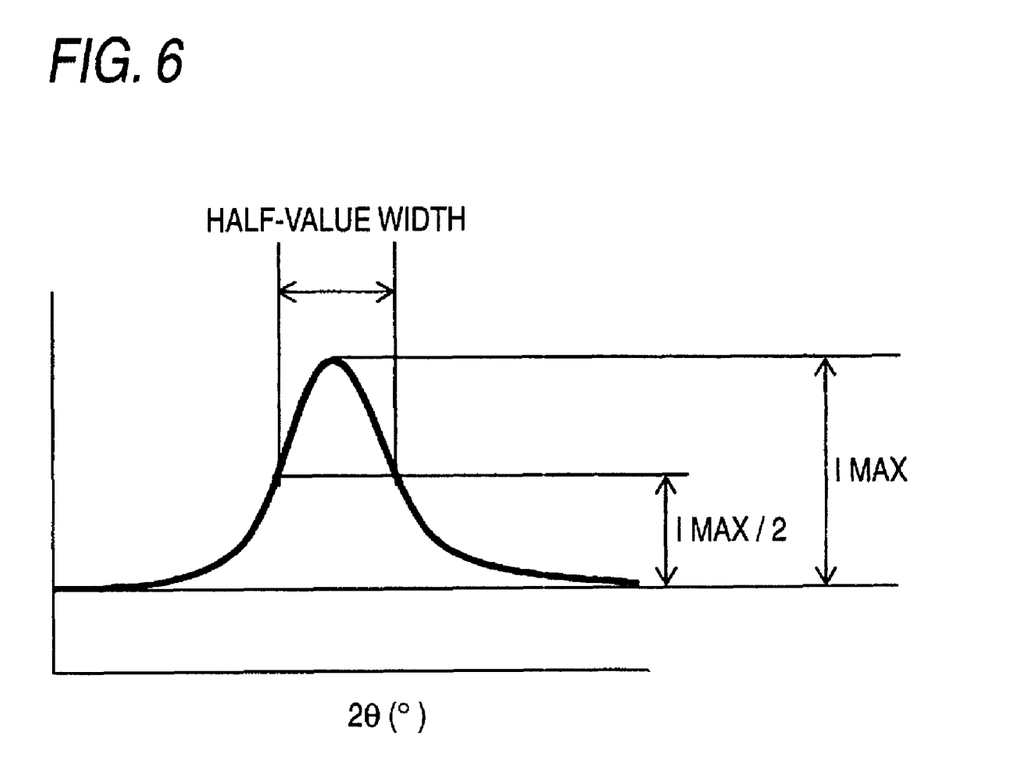
FIG. 6 is a conceptual diagram showing the half-value width.

Further, in the high-purity carbon fiber-reinforced carbon composite according to an exemplary embodiment of the present invention, a half-value width on the 002 plane (26.0 degree) in X-ray diffraction measurement is preferably about 0.5° or less, and more preferably about 0.4° or less. The crystallinity of the carbon material can be measured by X-ray diffraction measurement. As shown in FIG. 6, the half-value width means the width of strength at a height of one-half the peak height from the background. The lower half-value width shows the wider broadening of the crystal face and means the higher crystallinity. The X-ray diffraction measurement can be performed using a pulverized powder of the carbon fiber-reinforced carbon composite as a sample and using, for example, an X-ray diffractometer with Cu Kα radiation.

The crystallinity of the glassy carbon obtained by carbonizing the carbon fiber, the binder resin or the like by heat treatment or the like is low, and the crystallinity of the crystalline carbon-based powder obtained by heat treating coke, graphite or the like which is the easily crystallizable carbon-based material is high. The C/C composite according to an exemplary embodiment of the present invention includes the crystalline carbon-based powder in large amount, and the content of the binder resin and the glassy carbon is small by the amount. Accordingly, the half-value width on the 002 plane becomes a value within the above-mentioned range. On the other hand, in the related-art two-component C/C composite using no easily crystallizable carbon-based material and using the carbon fiber and the phenol resin as main raw material, the half-value width on the 002 plane is deduced to become 0.5° or more.

The true density is from about 2.0 to about 2.265 g/cm$^3$, and the bulk density is from about 1.40 to about 1.80 g/cm$^3$. This means that the C/C composite has the sufficient strength which can stand practical use since the theoretical value of porosity becomes from about 10 to about 38%. Further, the half-value width on the 002 plane (26.0 degree) in X-ray diffraction measurement is about 0.5° or less. This means that the crystallinity is high. Accordingly, the continuous pores are easily formed in the C/C composite, so that the gas for high refinement easily penetrates therein. It is therefore possible to remove the impurities present in the C/C composite with the refining gas while sufficiently securing the strength of the C/C composite.

Then, in the high-purity carbon fiber-reinforced carbon composite according to an exemplary embodiment of the present invention, the porosity is preferably from about 10 to about 35%, and more preferably from about 20 to about 35%. The porosity can be measured by the mercury penetration method, for example, using a porosimeter manufactured by Thermo Finnigan. When the porosity measured by the mercury penetration method is within such a range, a sufficient number of continuous pores are formed.

Further, the tensile strength in a fiber orientation direction of the high-purity carbon fiber-reinforced carbon composite according to an exemplary embodiment of the present invention is preferably about 50 MPa or more. When the tensile strength is about 50 MPa or more, the strength necessary as a member of a semiconductor manufacturing apparatus can be sufficiently obtained.

In the high-purity carbon fiber-reinforced carbon composite according to an exemplary embodiment of the present invention, the content of sulfur is about 5 ppm by mass or less, and preferably about 4 ppm by mass or less. The probability that sulfur or a sulfur compound is diffused or released from the member by use over the years at high temperatures exponentially increases with an increase in sulfur content. Therefore, for example, when the sulfur content is about 10 ppm by mass, the influence of diffusion and release of sulfur or the sulfur compound usually comes to be not negligible before the member reaches an end of its lifetime. In this respect, when the sulfur content can be suppressed to about 5 ppm by mass, the time when the influence of diffusion and release of sulfur or a sulfur compound appears approximately agrees with the time when the member reaches the end of its lifetime. For this reason, adjustment of the sulfur content to about 5 ppm by mass or less causes the member to become hardly affected by the diffusion and release of sulfur or the sulfur compound until the member reaches the end of its lifetime. Accordingly, when the sulfur content is about 5 ppm by mass or less, a high purity product can be obtained, and no problem of corrosion arises at a portion of contact with silver or the copper alloy. Incidentally, the lower limit value of the sulfur content is not particularly limited, and the sulfur content is preferably as small as possible and most preferably 0 ppm by mass. The sulfur content can be measured using a sample having a disk shape with a diameter of 20 mm and a thickness of 1 mm by Glow-Discharge Mass Spectrometry (GDMS).

<Production Method>

The high-purity C/C composite according to an exemplary embodiment of the present invention can be produced by the following method.

A method according to an exemplary embodiment of the present invention, the high-purity C/C composite can be obtained by refining the three-component C/C composite including a carbon fiber, a crystalline carbon-based powder and glassy carbon, which has been prepared using a carbon fiber, easily crystallizable carbon-based material and binder resin as raw materials, by a refining treatment process. As the three-component C/C composite, related-art three-component C/C composite can be utilized. For example, the three-component C/C composite can be produced by a method described in JP-A-07-48191 or WO2006-3774.

The easily crystallizable carbon-based material used in the high-purity carbon fiber-reinforced carbon composite according to an exemplary embodiment of the present invention includes petroleum-derived coke to be carbonized in a liquid phase or coal-derived coke, graphite obtained by carbonizing these cokes, or the like. The easily crystallizable carbon-based material is obtained using as a raw material a mineral resource formed by conversion of animal or plant plankton, so that it contains amino acids such as cysteine, methionine, and sulfur of biologic origin at high concentrations therein. The refining treatment process is performed mainly in order to remove such sulfur.

In the refining treatment, the three-component C/C composite is first vacuumed in a refining furnace, and then, heated at about 1,800 to about 2,400° C., preferably at about 1,900 to about 2,300° C. At about 1,800° C. or higher, removal of other metal elements does not become difficult, and at about 2,400° C. or lower, there is no fear that the crystallinity of the carbon fibers contained increases to become brittle. Vacuuming is preferably performed to about 10 kPa or less. Further, the retention time after heating is preferably from 0.1 to 4 hours.

Then, the composite is subjected to a first step of introducing a halogen-based gas into a refining furnace to about 50 kPa or more, and subsequently to a second step of performing vacuuming to about 20 kPa or less. Subsequently, the composite is subjected to the first step, the second step, the first step and the second step, and the treatment is terminated. This allows the metal impurities contained in the C/C composite to chemically change to metal halides which is easily volatilized at high temperatures, and to flow out from the inside of the pores to the outside of the material. Then, at this time, the impurities such as sulfur matter can be flowed out together as a sulfur-based gas to the outside of the pores. As the halogen-based gas, there can be used a halogen gas such as chlorine gas or fluorine gas, an organic halogen-based gas such as $CF_4$ or $CHCl_3$, or the like. In particular, chlorine gas is preferred.

Introduction of the halogen-based gas is performed up to about 50 kPa, and preferably up to about 60 kPa. This is because the metal impurities can be sufficiently removed.

Vacuuming is performed up to a degree of vacuum of about 20 kPa or less, more preferably about 10 kPa or less. This is because the impurities in the pores can be efficiently removed by performing vacuuming at a high degree of vacuum.

In the production method according to an exemplary embodiment of the present invention, refinement is not performed at a constant pressure, but the introduction of the halogen-based gas (the first step) and the vacuuming (the second step) are alternately repeated plural times, preferably 4 times or more. This is because the impurity-containing gas generated in the inside of the pores can be efficiently removed to the outside of the system by repeating the above-mentioned steps.

In the refining treatment process in the production method according to an exemplary embodiment of the present invention, a hydrogen baking step may be added between the introduction of the halogen-based gas (the first step) and the vacuuming (the second step). This is because it becomes easy to remove sulfur by baking it with hydrogen which easily forms a compound ($H_2S$) therewith, and moreover, because the impurity gas generated in the vacuuming step is easily removed, similarly to the above.

EXAMPLES

<Production of High-Purity Carbon Fiber-Reinforced Carbon Composite>

Example 1

Coal-derived green coke having an average particle size of 2 μm was used as an easily crystallizable carbon-based material, a PAN-based chopped fiber having an average diameter of 7 μm and a length of 5 mm was used as a carbon fiber, and a resol-based phenol resin was used as a binder resin. Then, 30% by mass of the easily crystallizable carbon-based material, 45% by mass of the carbon fiber and 25% by mass of the binder resin were mixed using a mixer, and pressing it using a mold having a 100×100 mm cavity at 20 MPa and 90° C. for 15 minutes to perform curing.

The resulting molded article was further treated at 150° C. for 30 minutes to completely cure it, and then, burned under a reducing atmosphere (hydrocarbon gas) up to 900° C. at a rate of temperature increase of 4° C./hour. Thereafter, it was burned in a subsequent high-temperature treating furnace under a nitrogen atmosphere up to 2,000° C. at a rate of temperature increase of 50° C./hour. The C/C composite thus obtained was processed to a size of 70×70×20 mm. Incidentally, the fiber therein is biaxially orientated in 70×70 directions.

The above-mentioned C/C composite was placed in a refining furnace, and vacuuming was performed to 20 kPa and heated. At the time when the temperature reached 2,100° C., chlorine gas was introduced until the pressure reached 60 kPa, and this state is retained for 1 minute (the first step). Vacuuming was performed again until the pressure reached 20 kPa (the second step). At the time when the pressure reached 20 kPa, the process returned to the above-mentioned first step. Thus, the first step and the second step were alternately repeated three times, respectively. The C/C composite in which the high refinement was terminated was cooled, and then, the pressure was recovered with nitrogen gas. Thereafter, the C/C composite was exposed to the atmosphere.

For the obtained C/C composite, the following evaluations were performed. The results are shown in Table 2.

True density: measured by a pycnometer method using helium gas by using Pycnometer manufactured by Yuasa Ionics Inc.

Bulk density: calculated by dividing the mass by the volume obtained by dimension measurement.

Porosity: measured by a mercury penetration method using a porosimeter manufactured by Thermo Finnigan (the porosity is obtained by multiplying the pore amount (cc/g) by the bulk density).

X-ray diffraction measurement: the (002) diffraction line of the C/C composite was measured using an X-ray diffractometer using Cu Kα radiation.

Tensile strength in a fiber orientation direction: measured by attaching a holder for a tensile test to Autograph AG-IS (5 kN) manufactured by Shimadzu Corporation.

<Impurity Analysis>

For the sample of Example 1 and a commercially available three-component C/C composite, to which refining treatment is not performed (Comparative Example 1), sulfur analysis and chlorine analysis were performed. The results thereof are also shown in Table 2.

TABLE 2

|  | Example 1 | Comparative Example 1 |
|---|---|---|
| Sulfur Content (ppm by mass) | 3.5 | 6.5 |
| Chlorine Content (ppm by mass) | 0.61 | 0.42 |
| True density (g/cm$^3$) | 2.24 | 2.24 |
| Bulk Density (g/cm$^3$) | 1.57 | 1.57 |
| Porosity (%) | 24.8 | 24.5 |
| X-Ray Diffraction Measurement (002) Half-Value Width (°) | 0.4 | 0.4 |
| Tensile Strength in Fiber Orientation Direction (MPa) | 92 | 87 |

As shown in Table 2, it is found that the C/C composite of Example 1 has been decreased in sulfur content by the refining treatment according to an exemplary embodiment of the present invention. Further, it is found that the chlorine content, the true density, the bulk density, the porosity, the half-value width on the 002 plane and the tensile strength in a fiber orientation direction scarcely vary, and the chlorine gas used for the refinement scarcely remains. That is, it is found that characteristics do not largely change. For chlorine, the content thereof somewhat increases by the high refinement, but is far less than 5 ppm by mass. If the content of chlorine is 5 ppm by mass or more, the influence thereof increases by use over the years. Accordingly, the influence of the chlorine is negligible.

According to an embodiment of the present invention, even the three-component C/C composite in which the metal elements are easily removed and the production processes are decreased can decrease pollution of silicon or corrosion of the copper alloy or silver contacting therewith in the silicon single crystal pulling-up apparatus.

Obviously, numerous modifications and variations of the present invention are possible in light of the above teachings. It is therefore to be understood that within the scope of the appended claims, the invention may be practiced otherwise than as specifically described herein.

What is claimed is:

1. A carbon fiber-reinforced carbon composite comprising:
    a matrix including a crystalline carbon-based powder and glassy carbon;
    a carbon fiber; and
    sulfur whose content is 5 ppm by mass or less.

2. The carbon composite according to claim 1, wherein the carbon composite has
    a true density from about 2.0 g/cm$^3$ to about 2.265 g/cm$^3$ measured with a pycnometer using a helium gas,
    a bulk density from about 1.40 g/cm$^3$ to about 1.80 g/cm$^3$,
    a half-value width of about 0.5° or less on a 002 plane determined by X-ray diffraction measurement, and
    a tensile strength of about 50 MPa or more in a fiber orientation direction.

3. The carbon composite according to claim 1, wherein the carbon composite has a porosity from about 10% to about 35% measured by a mercury penetration method.

4. The carbon composite according to claim 1, wherein the content of sulfur is about 4 ppm by mass or less.

5. A method for producing a carbon fiber-reinforced carbon composite, the method comprising:
    providing a carbon fiber-reinforced carbon composite in a refining furnace, the carbon fiber-reinforced carbon composite comprising a carbon fiber and a matrix including a crystalline carbon-based powder and glassy carbon;
    vacuum an inside of the refining furnace in which the carbon fiber-reinforced carbon composite is provided;
    heating the carbon fiber-reinforced carbon composite provided in the refining furnace to a temperature range from about 1,800° C. to about 2,400° C. after vacuuming the inside of the refining furnace;
    introducing a halogen-based gas into the refining furnace so that a pressure in the refining furnace becomes about 50 kPa or more in a first step after heating the carbon fiber-reinforced carbon composite;
    vacuuming the inside of the refining furnace so that the pressure in the refining furnace becomes about 20 kPa or less in a second step after the first step; and
    alternately repeating the first step and the second step.

6. The method according to claim 5, further comprising:
    hydrogen baking of the carbon fiber-reinforced carbon composite between the first step and the second step.

7. The carbon composite according to claim 1, wherein the carbon composite is constructed to be used as a semiconductor manufacturing apparatus.

8. The carbon composite according to claim 2, wherein the carbon composite has a porosity from about 10% to about 35% measured by a mercury penetration method.

9. The carbon composite according to claim 2, wherein the content of sulfur is about 4 ppm by mass or less.

10. A semiconductor manufacturing apparatus comprising a carbon fiber-reinforced carbon composite as defined in claim 1.

* * * * *